(12) United States Patent
Lu

(10) Patent No.: US 10,515,889 B2
(45) Date of Patent: Dec. 24, 2019

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/783,353

(22) Filed: Oct. 13, 2017

(65) Prior Publication Data

US 2019/0115294 A1  Apr. 18, 2019

(51) Int. Cl.
*H01L 23/498* (2006.01)
*H01L 23/00* (2006.01)
*H01L 23/31* (2006.01)
*H01L 21/683* (2006.01)
*H01L 21/48* (2006.01)

(52) U.S. Cl.
CPC ...... *H01L 23/49838* (2013.01); *H01L 21/486* (2013.01); *H01L 21/4853* (2013.01); *H01L 21/4857* (2013.01); *H01L 21/6835* (2013.01); *H01L 23/3128* (2013.01); *H01L 23/3135* (2013.01); *H01L 23/49816* (2013.01); *H01L 23/49822* (2013.01); *H01L 23/49827* (2013.01); *H01L 23/49866* (2013.01); *H01L 24/16* (2013.01); *H01L 24/32* (2013.01); *H01L 24/73* (2013.01); *H01L 24/13* (2013.01); *H01L 2221/68345* (2013.01); *H01L 2221/68359* (2013.01); *H01L 2224/13083* (2013.01); *H01L 2224/16014* (2013.01); *H01L 2224/16227* (2013.01); *H01L 2224/32225* (2013.01); *H01L 2224/73204* (2013.01)

(58) Field of Classification Search
CPC ............... H01L 23/49833; H01L 23/12; H01L 2224/05007; H01L 2224/05087
See application file for complete search history.

(56) References Cited

U.S. PATENT DOCUMENTS 8,458,900 B2  6/2013  Kodani et al.
9,171,797 B2 * 10/2015  Lin .................... H01L 21/6835
(Continued)

*Primary Examiner* — Latanya N Crawford
(74) *Attorney, Agent, or Firm* — Foley & Lardner LLP; Cliff Z. Liu

(57) ABSTRACT

A semiconductor package device includes an interconnection structure, an electronic component, a package body and an electrical contact. The dielectric layer has a top surface and a bottom surface. The dielectric layer defines a cavity extending from the bottom surface into the dielectric layer. A patterned conductive layer is disposed on the top surface of the dielectric layer. The conductive pad is at least partially disposed within the cavity and electrically connected to the patterned conductive layer. The conductive pad includes a first metal layer and a second metal layer. The second metal layer is disposed on the first metal layer and extends along a lateral surface of the first metal layer. The electronic component is electrically connected to the patterned conductive layer. The package body covers the electronic component and the patterned conductive layer. The electrical contact is electrically connected to the conductive pad.

23 Claims, 12 Drawing Sheets

(56) References Cited

U.S. PATENT DOCUMENTS

| | | | |
|---|---|---|---|
| 10,032,705 B2* | 7/2018 | Lee | H01L 23/13 |
| 2009/0146298 A1* | 6/2009 | Masumoto | H01L 23/3128 |
| | | | 257/737 |
| 2014/0070348 A1* | 3/2014 | Yee | H01L 27/14618 |
| | | | 257/432 |
| 2016/0013235 A1* | 1/2016 | Yee | H01L 27/14618 |
| | | | 257/432 |
| 2016/0049363 A1* | 2/2016 | Cheng | H01L 23/28 |
| | | | 257/774 |
| 2017/0018493 A1* | 1/2017 | Lee | H01L 23/13 |
| 2018/0005919 A1* | 1/2018 | Chen | H01L 21/561 |
| 2018/0151478 A1* | 5/2018 | Chen | H01L 21/4825 |

* cited by examiner

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same, and to a semiconductor package device including a soldering pad structure and a method of manufacturing the same.

2. Description of the Related Art

A semiconductor package device may include solder balls that electrically connect an electronic component to a substrate. In a comparative semiconductor package device, solder balls may be directly bonded to flat solder pads. Those solder pads are referred to as an "SMD" (solder mask defined) type solder pads. However, it may be challenging for the connection between the solder ball and the solder pad to sustain lateral stress without delamination of the solder ball.

To attempt to solve the above-mentioned problem, a lateral surface of a solder pad can be exposed from the substrate and the solder ball can be connected to both the lateral surface of the solder pad and a bottom surface of the solder pad. This type of solder pad is referred to as an "NSMD" (non-solder mask defined) type solder pad. However, due to a non-uniform barrier layer on the lateral surface and the bottom surface of the solder pads (e.g., the barrier layer is relatively thin on the lateral surface and is relatively thick on the bottom surface), an uneven intermetallic compound (IMC) layer may be formed (e.g., the IMC layer is relatively thick on the lateral surface and is relatively thin on the bottom surface). The relatively thick portion of the IMC may tend to crack. In addition, problematic soldering issues may arise such as a gap formed between the lateral surface of the pad and a dielectric layer of the substrate and/or contamination in such a gap.

In addition, some comparative fan-out processes may include a chip-last process and a chip-first process. In the chip-last fan-out process, conductive wires (having a line width and line space (L/S) of about 25/25 micrometer (μm)) and conductive pads are formed at a ball-side of a carrier, and a redistribution layer (RDL) (having an L/S of about 2/2 μm) is formed at a chip-side of the carrier to form conductive patterns. Then, the processes of die bond, molding, carrier removal and ball mounting are carried out to form a semiconductor package device with a fan-out structure. Although an IMC may exist between a solder ball and a conductive pad, such an IMC might not, in some implementations, significantly affect the reliability of the connection as long as the thickness of the conductive pad is greater than about 10 for example. However, the thicker conductive pad can increase the total size of the semiconductor package device, which can hinder miniaturization of the semiconductor package device. In addition, the conductive wires and the RDL are both made by a bumping process, which can increase the manufacturing cost.

In some comparative chip-first fan-out processes, a chip is placed on a carrier, solder balls and an RDL are formed thereon, the chip is bonded to a substrate by a flip-chip technique, and then a molding compound is formed to cover the chip. However, the chip-first fan-out process can have die yield loss issues. To attempt to overcome the die yield loss issues, the chip-last fan-out process can be used to replace the chip-first fan-out process. However, as mentioned above, to avoid the IMC issue (which can affect electrical performance), the thickness of the conductive pad may be greater than 10 which can hinder the miniaturization of the semiconductor package device. Therefore, it is desirable to solve the above IMC issues (e.g. in cases in which the thickness of the conductive pad is less than about 5 μm, for example) using the chip-last fan-out process.

SUMMARY

In one or more embodiments, a semiconductor package device includes an interconnection structure, an electronic component, a package body and an electrical contact. The dielectric layer has a top surface and a bottom surface. The dielectric layer defines a cavity extending from the bottom surface into the dielectric layer. A patterned conductive layer is disposed on the top surface of the dielectric layer. The conductive pad is at least partially disposed within the cavity and electrically connected to the patterned conductive layer. The conductive pad includes a first metal layer and a second metal layer. The second metal layer is disposed on the first metal layer and extends along a lateral surface of the first metal layer. The electronic component is electrically connected to the patterned conductive layer. The package body covers the electronic component and the patterned conductive layer. The electrical contact is electrically connected to the conductive pad.

In one or more embodiments, a semiconductor package device includes an interconnection structure, an electronic component, a first package body, a substrate and an electrical contact. The dielectric layer has a top surface and a bottom surface. The dielectric layer defines a cavity extending from the bottom surface into the dielectric layer. The patterned conductive layer is disposed on the top surface of the dielectric layer. The conductive pad is at least partially disposed within the cavity and electrically connected to the patterned conductive layer. The conductive pad includes a first metal layer and a second metal layer. The second metal layer is disposed on the first metal layer and extends along a lateral surface of the first metal layer. The electronic component is electrically connected to the patterned conductive layer. The first package body covers the electronic component and the patterned conductive layer. The electrical contact electrically connects the conductive pad to the substrate.

In one or more embodiments, a method of manufacturing a semiconductor package device includes providing a carrier, forming a first metal layer on the carrier, forming a second metal layer on the carrier to cover the first metal layer, forming a dielectric layer on the first metal layer and the second metal layer, and forming a patterned conductive layer on the dielectric layer. The method further includes providing an electronic component electrically connected to the patterned conductive layer, removing the carrier and a portion of the second metal layer to expose a bottom surface of the first metal layer and a portion of a lateral surface of the first metal layer, and forming an electrical contact electrically connected to the bottom surface of the first metal layer and the portion of the lateral surface of the first metal layer. A thickness of the first metal layer is greater than a thickness of the second metal layer.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1:
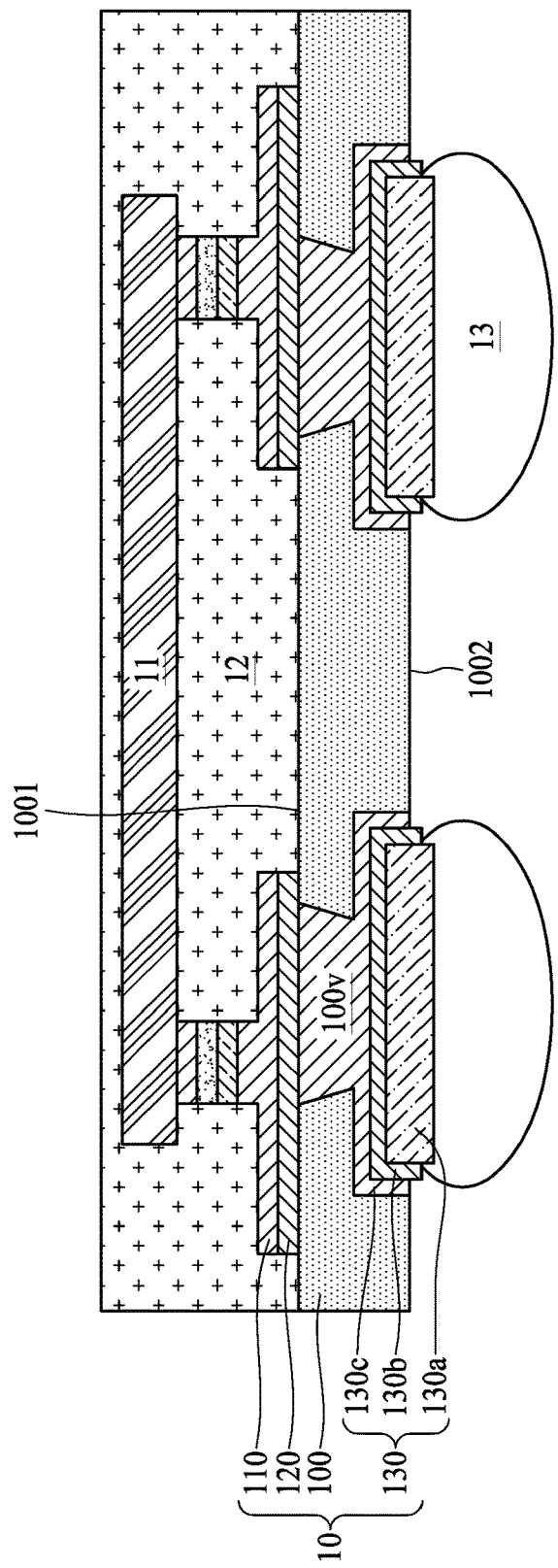
FIG. 1 illustrates a cross-sectional view of a semiconductor package device in accordance with some embodiments of the present disclosure.

FIG. 1 illustrates a cross-sectional view of a semiconductor package device 1 in accordance with some embodiments of the present disclosure. The semiconductor package device 1 includes an interconnection structure 10, an electronic component 11, a package body and an electrical contact 13. The interconnection structure 10 includes a dielectric layer 100, a conductive layer 110 (e.g. a patterned conductive layer 110), a via 100v and a conductive pad 130.

The dielectric layer 100 has a top surface 1001 (also referred to as first surface) and a bottom surface 1002 (also referred to as second surface) opposite to the top surface 1001. In some embodiments, the dielectric layer 100 may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, the dielectric layer 100 may include an inorganic material, such as silicon, a ceramic or the like.

The dielectric layer 100 defines a cavity extending from the bottom surface 1002 into the dielectric layer 100. The conductive pad 130 is partially disposed within the cavity of the dielectric layer 100. For example, a first portion of the conductive pad 130 is disposed within the dielectric layer 100 and a second portion of the conductive pad 130 protrudes from the bottom surface 1002 of the dielectric layer 100. The electrical contact 13 (e.g. a solder ball or a solder bump) is disposed on the conductive pad 130 to provide for electrical connections between the semiconductor package device 1 and other circuits or circuit boards. In some embodiments, the electrical contact 13 is a controlled collapse chip connection (C4) bump, a ball grid array (BGA) or a land grid array (LGA). In some embodiments, a diameter of the electrical contact 13 is in a range of about 0.1 millimeter (mm) to about 0.3 mm.

The conductive pad 130 includes a metal layer 130a, a metal layer 130b and a metal layer 130c. In one or more embodiments, one of the metal layer 130a, the metal layer 130b, and the metal layer 130c may be omitted. The metal layer 130c is disposed on sidewalls and on a bottom surface of the cavity of the dielectric layer 100. For example, the metal layer 130c extends along the sidewalls of the cavity of the dielectric layer 100. For example, at least a portion of the metal layer 130c is surrounded by the dielectric layer 100. The metal layer 130c defines a cavity facing toward the bottom surface 1002 of the dielectric layer 100 to accommodate at least a portion of the metal layer 130b. For example, the metal layer 130b is disposed on sidewalls and on a bottom surface of the cavity of the metal layer 130c. For example, the metal layer 130b extends along the sidewalls of the cavity of the metal layer 130c. For example, at least a portion of the metal layer 130b is surrounded by the metal layer 130c. The metal layer 130b defines a cavity facing toward the bottom surface 1002 of the dielectric layer 100 to accommodate at least a portion of the metal layer 130a. For example, the metal layer 130a is disposed on sidewalls and a bottom surface of the cavity of the metal layer 130b. For example, at least a portion of the metal layer 130a is surrounded by the metal layer 130b. In some embodiments, a portion of the metal layer 130a (e.g. at least a portion of a lateral surface of the metal layer 130a) is covered by the electrical contact 13 to increase the bonding strength between the metal layer 130a and the electrical contact 13. In some embodiments, at least one of the metal layers 130a, 130b or 130c do not extend along (e.g. do not cover) the bottom surface 1002 of the dielectric layer 100. Alternatively, one or more of the metal layers 130a, 130b and 130c may extend on and along the bottom surface 1002 of the dielectric layer 100, in accordance with some embodiments. The metal layer 130c may extend along at least a portion of a lateral surface of the metal layer 130b. The metal layer 130b may extend along at least a portion of the lateral surface of the metal layer 130a.

In some embodiments, a width of the metal layer 130c is greater than a width of the metal layer 130b, and the width of the metal layer 130b is greater than a width of the metal layer 130a. For example, the metal layers 130a, 130b and 130c define a stepped structure. In some embodiments, the metal layer 130a and the metal layer 130b protrude from the bottom surface 1002 of the dielectric layer 100. In some embodiments, the metal layer 130c does not protrude from the bottom surface 1002 of the dielectric layer 100. In some embodiments, the metal layer 130a includes at least one of gold (Au), palladium (Pd), silver (Ag), another metal, or an alloy thereof. In some embodiments the metal layer 130b includes at least one of nickel (Ni), titanium tungsten (TiW), aluminum (Al), another metal, or an alloy thereof. In some embodiments, the metal layer 130c includes at least one of copper (Cu), Au, Ag, Pd, another metal, or an alloy thereof.

In some embodiments, a thickness of the metal layer 130a is greater than a thickness of the metal layer 130b. In some embodiments, a sum of a thickness of the metal layer 130a and a thickness of the metal layer 130b is greater than a thickness of the metal layer 130c. For example, the thickness of the metal layer 130a is in a range of about 0.1 micrometer (μm) to about 1.5 μm, the thickness of the metal layer 130b is in a range of about 0.1 μm to about 0.5 μm and the thickness of the metal layer 130c is in a range of about 0.1 μm to about 3 μm. In some embodiments, a total thickness of the conductive pad 130 (including the metal layers 130a, 130b and 130c) is in a range of about 0.3 μm to about 5 μm, or is less than or equal to about 5 μm.

In some embodiments, the metal layer 130b is provided as a barrier layer (or stop layer) to eliminate or reduce formation of an IMC layer between the electrical contact 13 and the metal layer 130c. In addition, the conductive pad 130 (e.g. which defines a stepped structure) can prevent the electrical contact 13 from directly contacting the inner layer (e.g., the metal layer 130c) of the conductive pad 130 (e.g. during the formation of the electrical contact 13).

In addition, if a shear stress is applied to the conductive pad 130 and the electrical contact 13, a shear crack might first occur at an interface between the metal layer 130a and the metal layer 130b (e.g. before occurring of a shear crack, or thereby preventing occurrence of a shear crack, at an interface between the metal layer 130b and the metal layer 130c). Furthermore, because at least a portion of a lateral surface of the metal layer 130a is covered by the metal layer 130b and at least a portion of the lateral surface of the metal layer 130b is covered by the metal layer 130c, a moment caused by a force in a direction perpendicular to the bottom surface 1002 of the dielectric layer 100 is relatively small, which can help to prevent the metal layers 130a, 130b and 130c from delaminating.

A seed layer 120 is disposed on the top surface 1001 of the dielectric layer 100 and electrically connected to the conductive pad 130 through the via 100v. The conductive layer 110 is disposed on the seed layer 120. In some embodiments, the conductive layer 110 includes Cu, Ag, Au, Pt, Al, another metal, a solder alloy, or a combination of two or more thereof. In some embodiments, a portion of the conductive layer 110 can be covered by a protection layer (not shown), such as a solder resist layer.

The electronic component 11 is disposed on the top surface 1001 of the dielectric layer 100 and electrically connected to the conductive layer 110. The electronic component 11 may include a chip or a die including a semiconductor substrate, one or more integrated circuit devices, and/or one or more overlying interconnection structures disposed therein. The integrated circuit devices may include active devices such as transistors and/or passive devices such resistors, capacitors, inductors, or a combination of two or more thereof. In some embodiments, the electronic component 11 is electrically connected to the conductive layer 110 by a flip-chip technique. The conductive layer 110 may have an L/S less than or equal to about 10 μm.

The package body 12 is disposed on the top surface 1001 of the dielectric layer 11 and covers the electronic component 11. In some embodiments, the package body 12 includes, for example, one or more organic materials (e.g., a molding compound, bismaleimide triazine (BT), a PI, a polybenzoxazole (PBO), a solder resist, an ABF, a polypropylene (PP), an epoxy-based material, or a combination of two or more thereof), inorganic materials (e.g., silicon, a glass, a ceramic, a quartz, or a combination of two or more thereof), a liquid-film material or a dry-film material, or a combination of two or more thereof.

Figure 2:
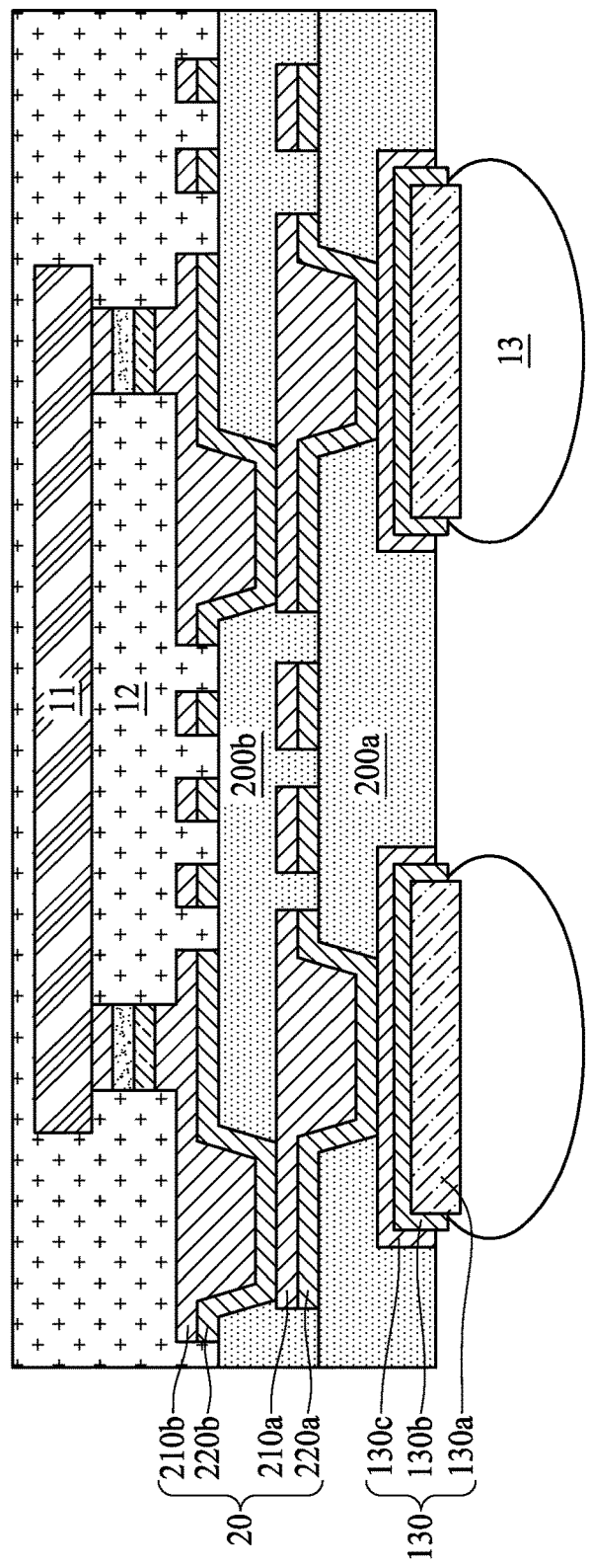
FIG. 2 illustrates a cross-sectional view of a semiconductor package device in accordance with some embodiments of the present disclosure.

FIG. 2 illustrates a cross-sectional view of a semiconductor package device 2 in accordance with some embodiments of the present disclosure. The semiconductor package device 2 is similar to the semiconductor package device 1 in FIG. 1, but differs in some ways. For example, an interconnection structure 20 is included in the semiconductor package device 2 instead of, or in addition to, the interconnection structure 10. The conductive pad 130 is further included in the semiconductor package device 2. In the embodiments described below, the conductive pad 130 is referred to as a component separate from the interconnection structure 20, but in some embodiments the conductive pad 130 may be included in the interconnection structure 20. The interconnection structure 20 includes multiple layers.

The semiconductor package device 2 includes a dielectric layer 200a and a dielectric layer 200b. The dielectric layer 200a encapsulates or surrounds at least a portion of the conductive pad 130. The dielectric layer 200a defines a cavity (e.g. at a top surface of the dielectric layer 200a) that exposes a portion of the metal layer 130c of the conductive pad 130. A seed layer 220a is disposed on the dielectric layer 200a and extends into the cavity of the dielectric layer 200a to be electrically connected to the exposed portion of the metal layer 130c of the conductive pad 130. A conductive layer 210a is disposed on the seed layer 220a and within the cavity of the dielectric layer 200a.

The dielectric layer 200b is disposed on the dielectric layer 200a and covers the conductive layer 210a. The dielectric layer 200b defines a cavity (e.g. at a top surface of the dielectric layer 200a) that exposes a portion of the conductive layer 210a. A seed layer 220b is disposed on the dielectric layer 200b and extends into the cavity of the dielectric layer 200b to be electrically connected to the exposed portion of the conductive layer 210a. A conductive layer 210b is disposed on the seed layer 220b and within the cavity of the dielectric layer 200b. In some embodiments, a line width and line space (L/S) of the conductive layer 210a is greater than an L/S of the conductive layer 210b. For example, the L/S of the conductive layer 210a is in a range of about 5 μm to about 15 μm, and the L/S of the conductive layer 210b is in a range of about 2 μm to about 5 μm.

Figure 3:
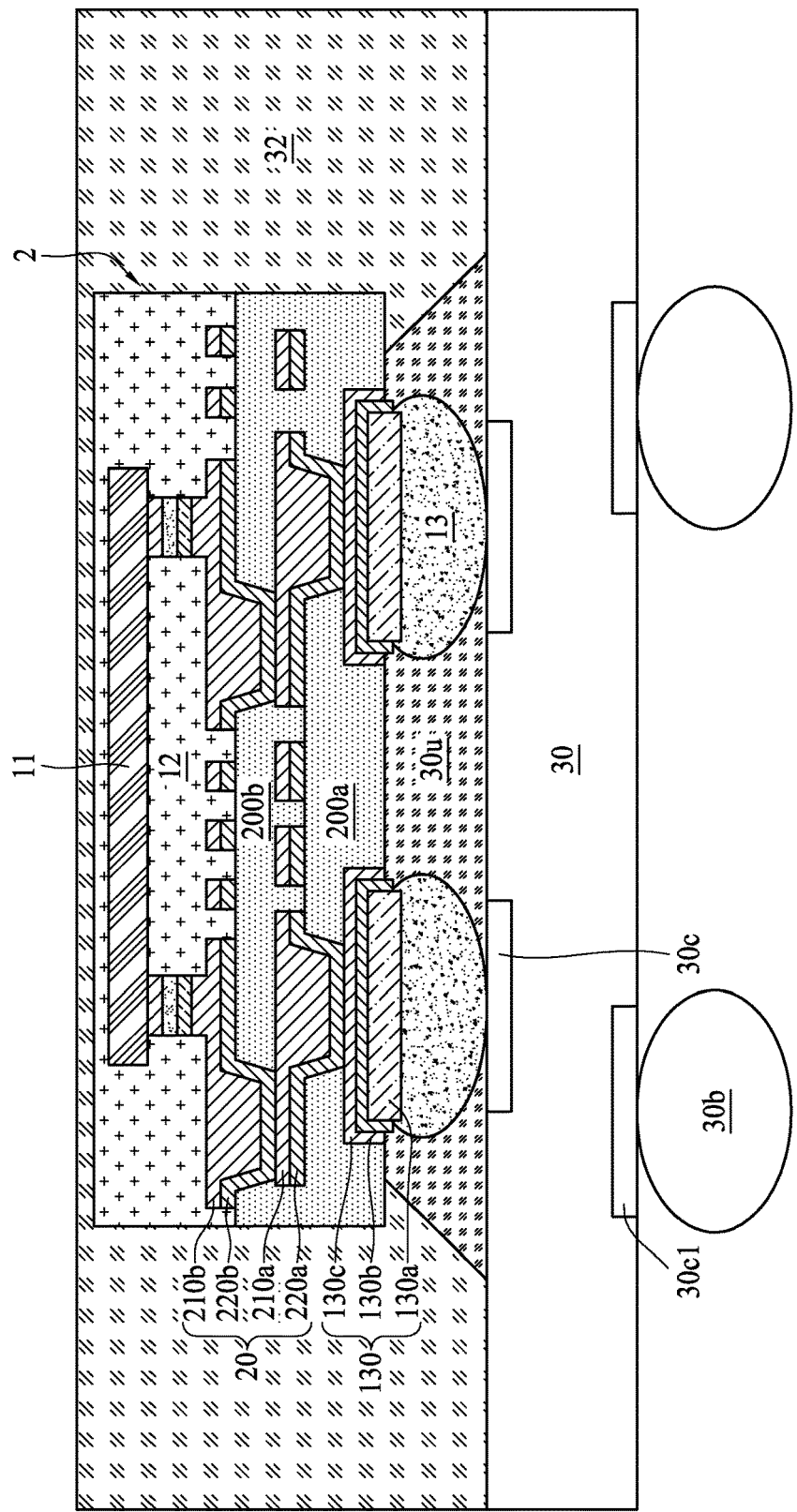
FIG. 3 illustrates a cross-sectional view of a semiconductor package device in accordance with some embodiments of the present disclosure.

FIG. 3 illustrates a cross-sectional view of an electrical device 3 in accordance with some embodiments of the present disclosure. The electrical device 3 includes the semiconductor package device 2 as shown in FIG. 2, a substrate 30, a package body 32 and electrical contacts 30b. In some embodiments, the electrical device 3 may include an underfill 30u disposed between the semiconductor package device 2 and the substrate 30, and the package body 32 encapsulates the semiconductor package device 2 and the underfill 30u. The substrate 30 may include, or may be attached to, a conductive layer (or conductive pad) 30c (e.g. a patterned conductive layer 30c) disposed at a top surface of the substrate 30a, and a conductive layer (or conductive pad) 30c1 disposed at a bottom surface of the substrate 30. The electrical contacts 30b are disposed on the conductive layer 30c1 (or conductive pad) on the bottom surface of the substrate 30 to provide for electrical connections. In other embodiments, the semiconductor package device 2 can be replaced by the semiconductor package device 1 as shown in FIG. 1 depending on design specifications.

The semiconductor package device 2 is disposed on the substrate 30 and electrically connected to the conductive layer 30c (or conductive pad) on the substrate 30. The substrate 30 may include, for example, a printed circuit board, such as a paper-based copper foil laminate, a composite copper foil laminate, or a polymer-impregnated glass-fiber-based copper foil laminate. The substrate 30 may include an interconnection structure, such as an RDL or a grounding element. In some embodiments, an L/S of the conductive layer 30c on the substrate 30 is greater than or equal to about 10 µm.

The package body 32 is disposed on substrate 30 and covers the semiconductor package device 2. In some embodiments, the package body 32 includes, for example, one or more organic materials (e.g., a molding compound, BT, a PI, a PBO, a solder resist, an ABF, a PP, an epoxy-based material, or a combination of two or more thereof), inorganic materials (e.g., silicon, a glass, a ceramic, a quartz, or a combination of two or more thereof), a liquid-film material, a dry-film material, or a combination of two or more thereof.

In some embodiments, the electrical contact 13 of the semiconductor package device 2 may be covered or encapsulated by the underfill 30u, and the package body 32 is disposed on substrate 30 to cover the semiconductor package device 2 and the underfill 30u. In some embodiments, the underfill 30u includes an epoxy resin, a molding compound (e.g., an epoxy molding compound or other molding compound), a polyimide, a phenolic compound or material, a material including a silicone dispersed therein, or a combination of two or more thereof. In some embodiments, the underfill may be a capillary underfill (CUF), a molded underfill (MUF) or a dispensing gel, depending on specifications of different embodiments.

FIG. 4A, FIG. 4B, FIG. 4C, FIG. 4D, FIG. 4E, FIG. 4F, FIG. 4G and FIG. 4H are cross-sectional views of a semiconductor structure fabricated at various stages, in accordance with some embodiments of the present disclosure. At least some figures have been simplified for a better understanding of the aspects of the present disclosure.

Figure 4A:
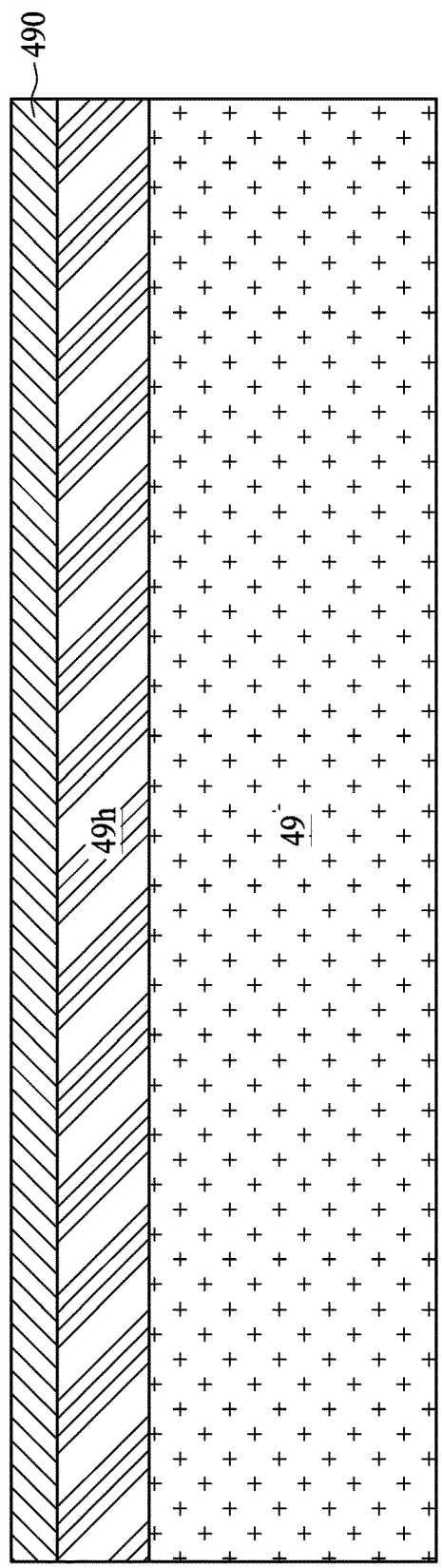
FIG. 4A illustrates one or more stages of a method of manufacturing a semiconductor package device in accordance with some embodiments of the present disclosure.

Referring to FIG. 4A, a carrier 49 is provided and a seed layer 490 is attached to the carrier 49 through an adhesive (or release film) 49h. In some embodiments, the seed layer 490 includes a titanium and copper alloy (Ti/Cu) or other suitable materials. In some embodiments, the seed layer 490 may be formed by physical vapor deposition (PVD) or other suitable processes.

Figure 4B:
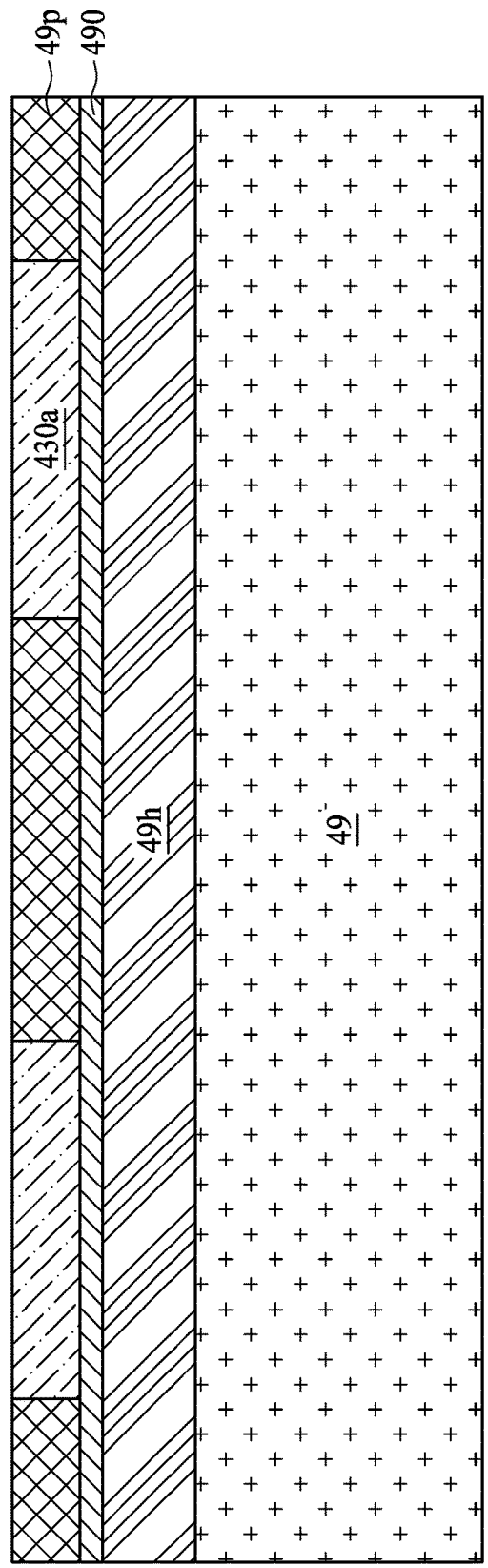
FIG. 4B illustrates one or more stages of a method of manufacturing a semiconductor package device in accordance with some embodiments of the present disclosure.

Referring to FIG. 4B, a photoresist 49p is formed on the seed layer 490. One or more openings are formed in the photoresist 49 by, for example, a lithographic technique, to expose a portion of the seed layer 490. A metal layer 430a is formed within the one or more openings of the photoresist 49p. In some embodiments, the metal layer 430a is formed by, for example, plating.

Figure 4C:
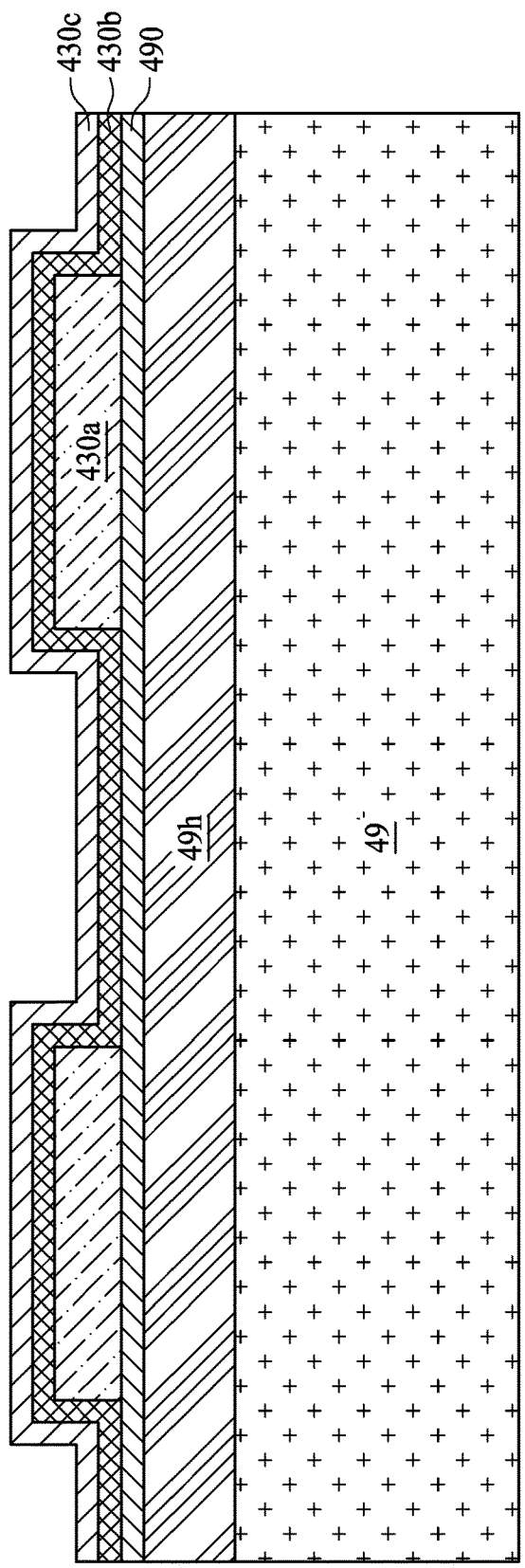
FIG. 4C illustrates one or more stages of a method of manufacturing a semiconductor package device in accordance with some embodiments of the present disclosure.

Referring to FIG. 4C, the photoresist 49p is removed from the seed layer 490, and a metal layer 430b is formed on the seed layer 490 and on the metal layer 430a, and a portion of the metal layer 430b may be disposed between portions of the metal layer 430a. In some embodiments, the metal layer 430b and the seed layer 490 include a same material. The metal layer 430b and the seed layer 490 may include different materials. In some embodiments, the metal layer 430b may be formed by PVD or other suitable processes. A metal layer 430c is formed on the metal layer 430b, and a portion of the metal layer 430c may be disposed between portions of the metal layer 430a. A thickness of the metal layer 430a may be about equal to or greater than a thickness of the metal layer 340b. A thickness of the third metal layer may be about equal to or less than a sum of the thickness of the first metal layer and the thickness of the second metal layer.

Figure 4D:
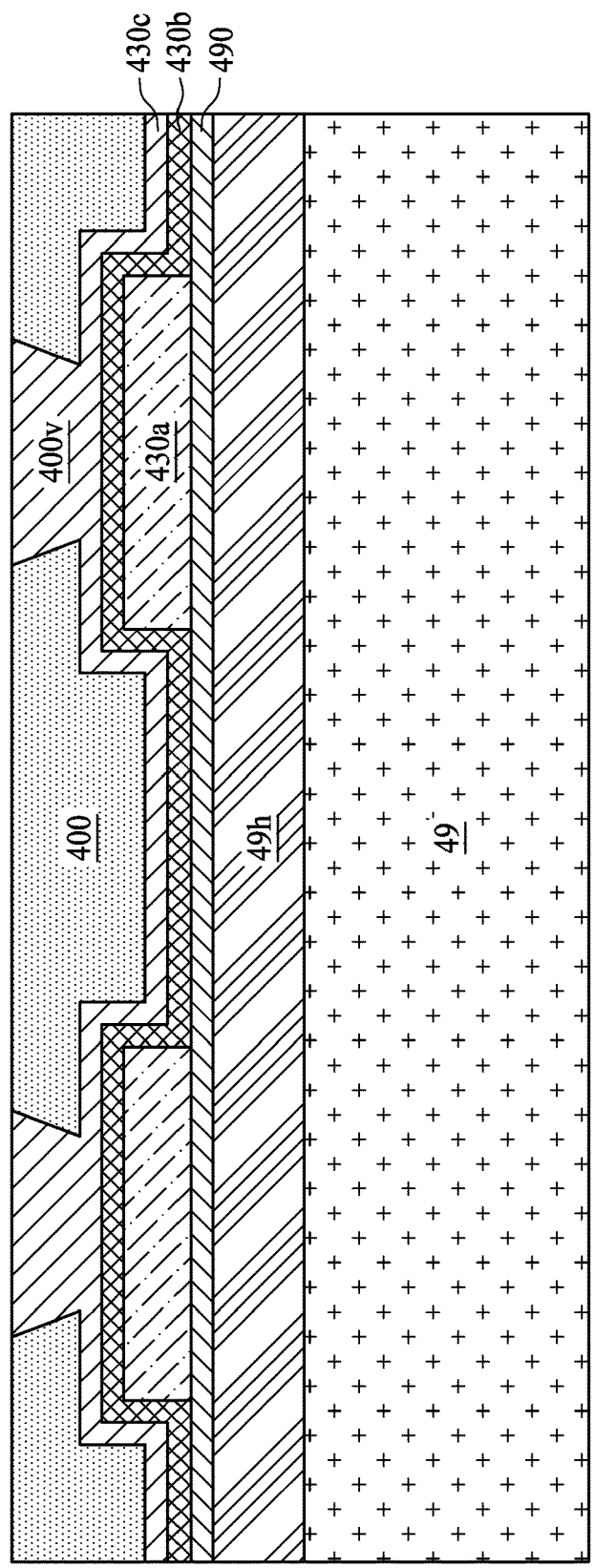
FIG. 4D illustrates one or more stages of a method of manufacturing a semiconductor package device in accordance with some embodiments of the present disclosure.

Referring to FIG. 4D, a passivation layer (or dielectric layer) 400 is formed on the metal layer 430c to cover the metal layer 430c. In some embodiments, the passivation layer 400 is formed by coating or other suitable processes. One or more openings are formed in the passivation layer 400 by, for example, a lithographic technique to expose a portion of the metal layer 430c. A conductive material 400v (e.g., constituting at least a portion of a via) is then formed within the openings of the passivation later 400 to be electrically connected to the exposed portion of the metal layer 430c. In some embodiments, the conductive material 400v is formed by plating or other suitable processes. A portion of the conductive material 400v may be exposed from the passivation layer 400.

Figure 4E:
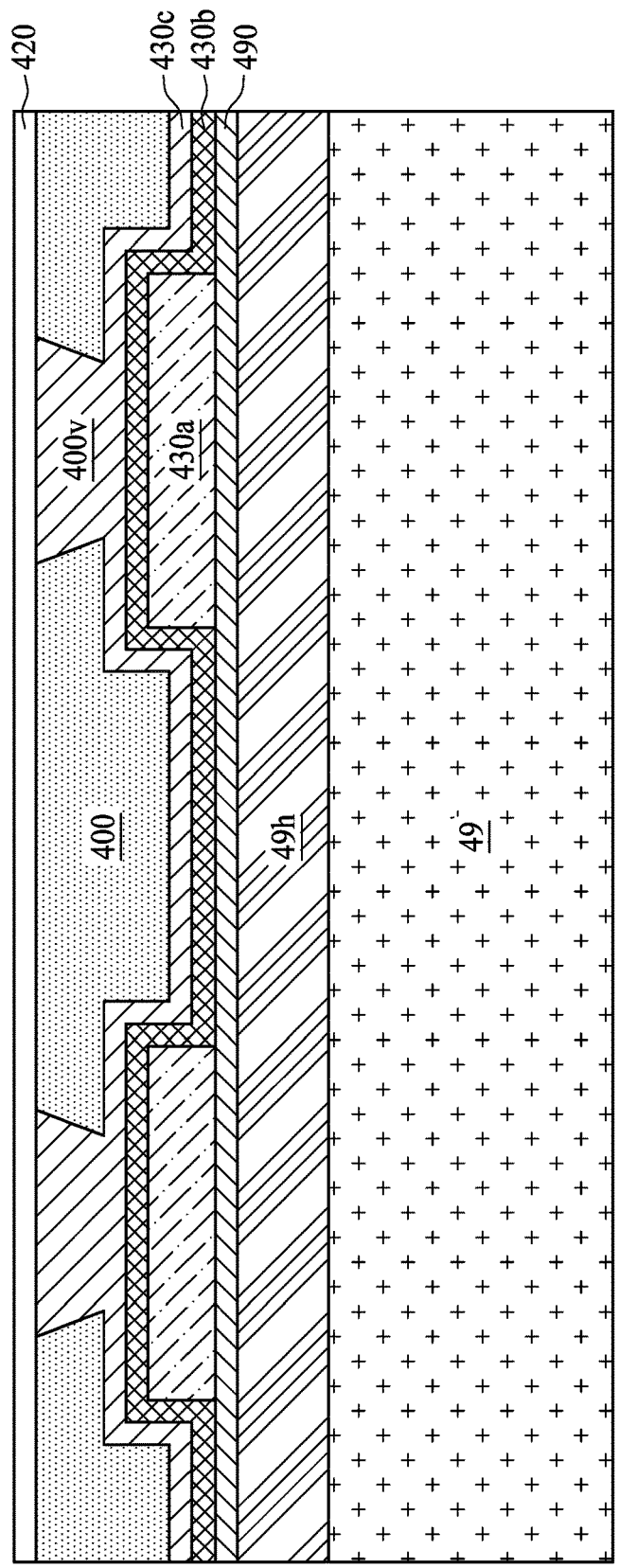
FIG. 4E illustrates one or more stages of a method of manufacturing a semiconductor package device in accordance with some embodiments of the present disclosure.

Referring to FIG. 4E, a seed layer 420 is formed on the passivation layer 400 and electrically connected to the exposed portion of the conductive material 400v. In some embodiments, the seed layer 420 includes Ti, Cu or other suitable materials. In some embodiments, the seed layer 420 may be formed by PVD or other suitable processes.

Figure 4F:
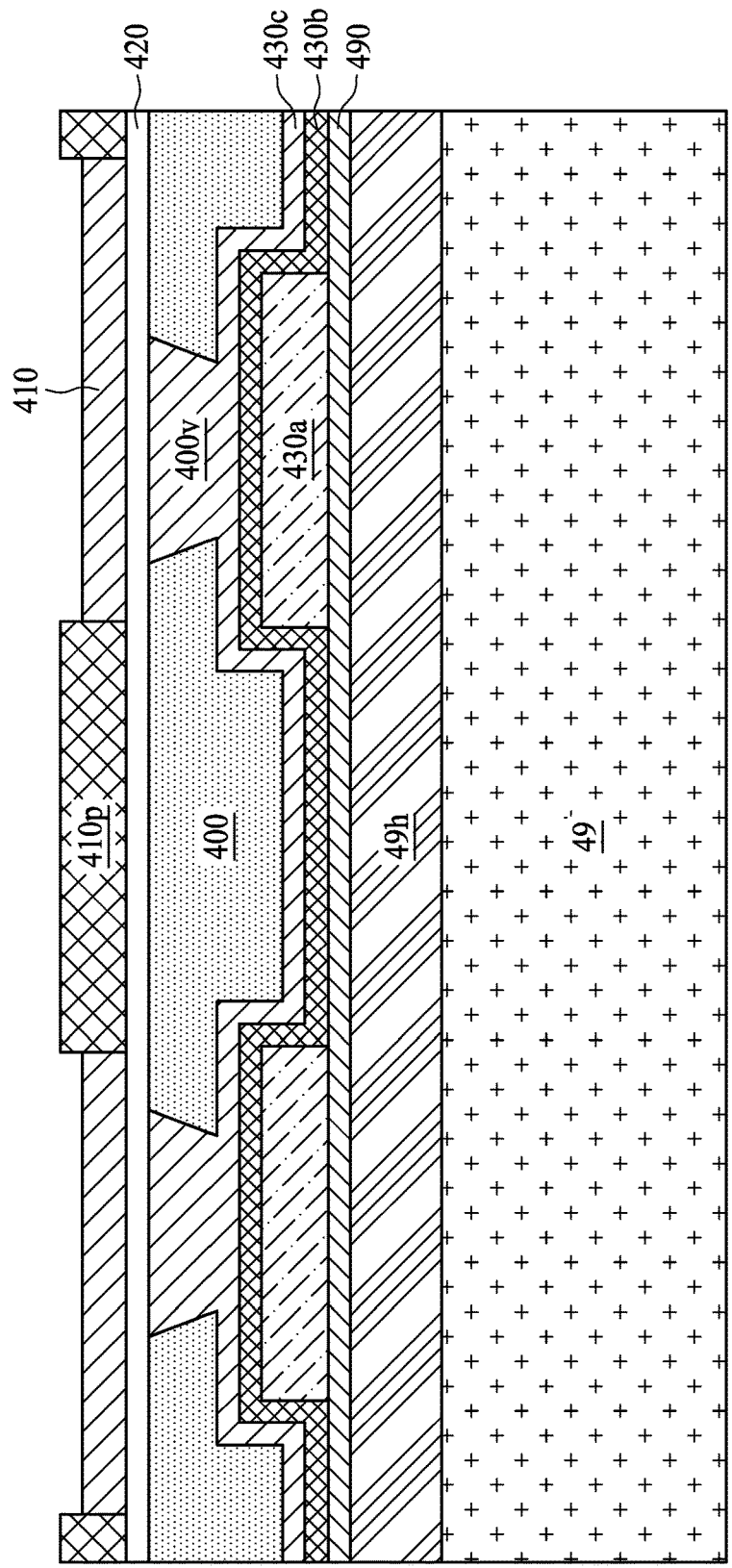
FIG. 4F illustrates one or more stages of a method of manufacturing a semiconductor package device in accordance with some embodiments of the present disclosure.

Referring to FIG. 4F, a photoresist 410p is formed on the seed layer 420. One or more openings are formed in the photoresist 410p by, for example, a lithographic technique, to expose a portion of the seed layer 420. A conductive layer 410 (e.g. a patterned conductive layer 410) is formed within the openings of the photoresist 410p. In some embodiments, the conductive layer 410 is formed by, for example, plating. An electrical component 11 may be provided and electrically connected to the conductive layer 410.

Figure 4G:
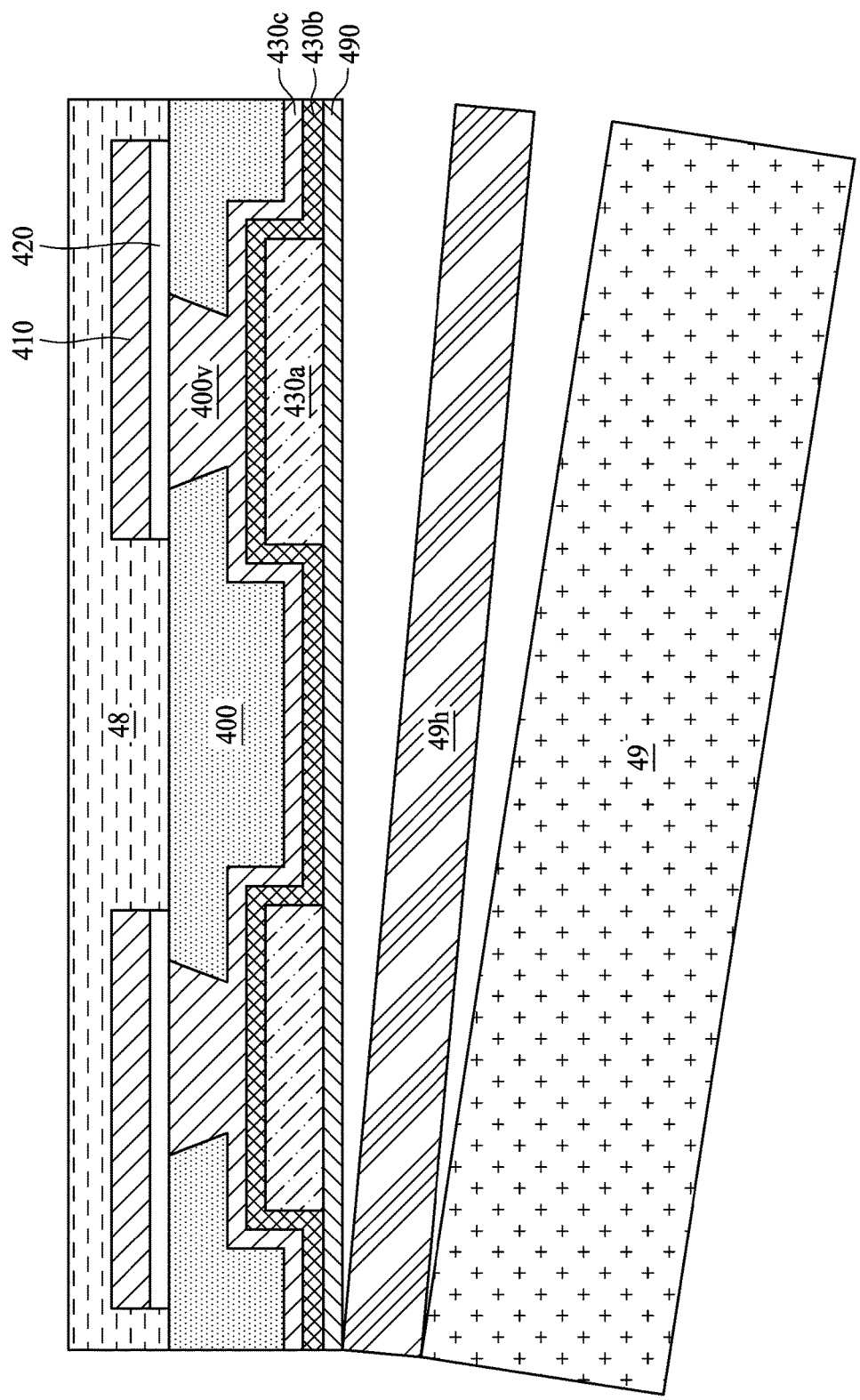
FIG. 4G illustrates one or more stages of a method of manufacturing a semiconductor package device in accordance with some embodiments of the present disclosure.

Referring to FIG. 4G, the photoresist 410p and a portion of the seed layer 420 that is not covered by the conductive layer 410 are removed. A protection layer 48 is formed on the passivation layer 400 to cover the conductive layer 410. In some embodiments, the protection layer 48 includes one or more organic materials, and can include a passivation layer, a solder mask or the like. In some embodiments, the protection layer 48 is attached to the passivation layer 400 by lamination. The carrier 49 and the adhesive 49h are then removed.

Figure 4H:
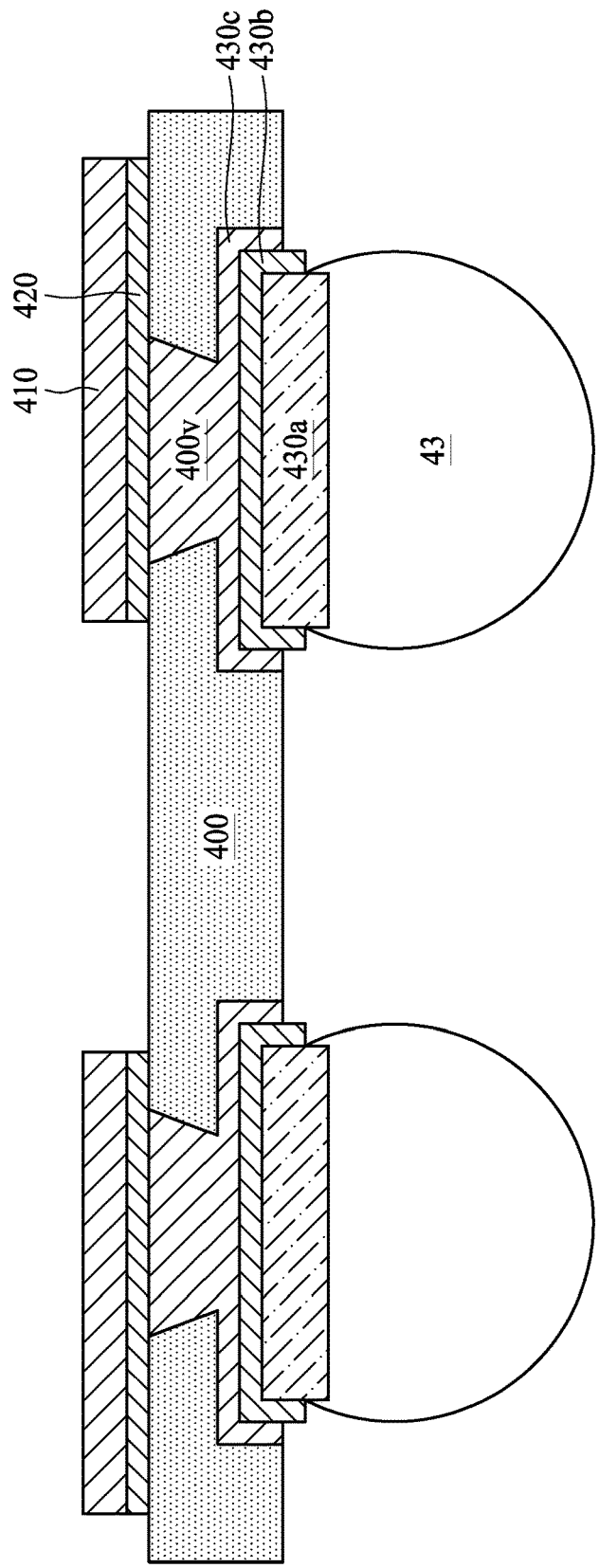
FIG. 4H illustrates one or more stages of a method of manufacturing a semiconductor package device in accordance with some embodiments of the present disclosure.

Referring to FIG. 4H, the seed layer 490 (e.g. formed of a Ti/Cu alloy) is removed to expose a portion of the metal layer 430a. In some embodiments, the seed layer 490 is removed by, for example, etching or other suitable processes. In some embodiments, two etching processes may be carried out to remove the seed layer 490, such as one etching process for removing Ti and another for removing Cu. In some embodiments, at least a portion of the metal layer 430b is removed to expose at least a portion of a lateral surface of the metal layer 430a. In some embodiments, at least a portion of the metal layer 430c is removed to expose at least a portion of a lateral surface of the metal layer 430b. The protection layer 48 is removed to expose the conductive layer 410 and a portion of the passivation layer 400. Electrical contacts 43 (e.g., bumps or solder balls) are then formed on the metal layer 430a to form the interconnection structure 10 of semiconductor package device 1 as shown in FIG. 1. In some embodiments, the electrical contacts 43 can be formed by, for example, plating, electroless plating, sputtering, paste printing, bumping or a bonding process.

Figure 5B:
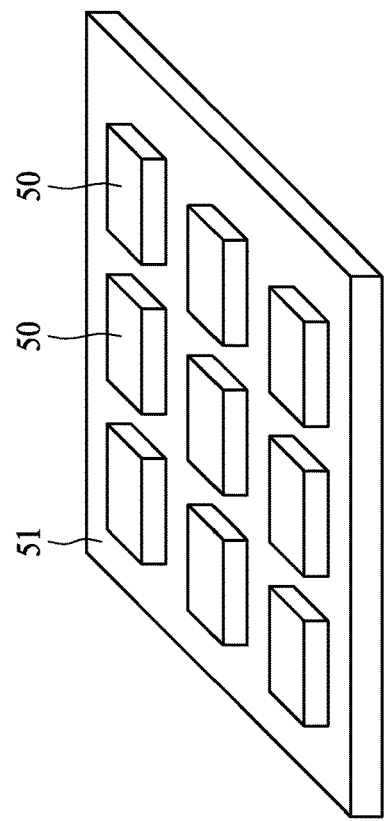
FIG. 5B illustrates semiconductor package devices in accordance with some embodiments of the present disclosure.
Figure 5A:
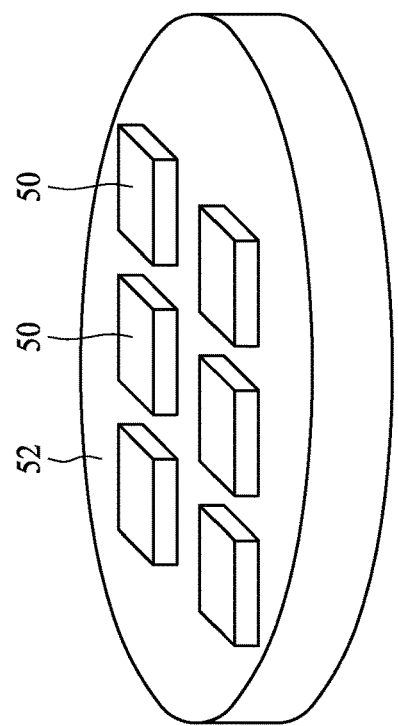
FIG. 5A illustrates semiconductor package devices in accordance with some embodiments of the present disclosure.

FIG. 5A and FIG. 5B illustrate different types of semiconductor package devices in accordance with some embodiments of the present disclosure.

As shown in FIG. 5A, a plurality of chips or dies 50 are placed on a square-shaped carrier 51. In some embodiments, the carrier 51 may include organic materials (e.g., a molding compound, BT, a PI, a PBO, a solder resist, an ABF, a PP, an epoxy-based material, or a combination of two or more thereof) or inorganic materials (e.g., silicon, a glass, a ceramic, a quartz, or a combination of two or more thereof).

As shown in FIG. 5B, a plurality of chips or dies 50 are placed on a circle-shaped carrier 52. In some embodiments, the carrier 52 may include organic materials (e.g., a molding compound, BT, a PI, a PBO, a solder resist, an ABF, a PP, epoxy-based material, or a combination of two or more thereof) or inorganic materials (e.g., silicon, a glass, a ceramic, a quartz, or a combination of two or more thereof).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
an interconnection structure, comprising:
a dielectric layer having a top surface and a bottom surface, the dielectric layer defining a cavity extending from the bottom surface into the dielectric layer;
a patterned conductive layer disposed on the top surface of the dielectric layer;
a conductive pad at least partially disposed within the cavity and electrically connected to the patterned conductive layer, the conductive pad comprising a first metal layer, a second metal layer and a third metal layer, wherein the second metal layer is disposed on the first metal layer and extends along a lateral surface of the first metal layer, and the third metal layer is disposed on the second metal layer and extends along a lateral surface of the second metal layer without extending along the bottom surface of the dielectric layer;
an electronic component electrically connected to the patterned conductive layer;
a package body covering the electronic component and the patterned conductive layer; and
a solder bump electrically connected to the conductive pad,
wherein the second metal layer is disposed between the solder bump and the third metal layer, at least a portion of the second metal layer is in contact with the solder bump, and the second metal layer is configured to function as a barrier layer.

2. The semiconductor package device of claim 1, wherein a width of the third metal layer is greater than a width of the second metal layer, and the width of the second metal layer is greater than a width of the first metal layer.

3. The semiconductor package device of claim 1, wherein the third metal layer comprises at least one of copper (Cu), gold (Au), silver (Ag) or palladium (Pd).

4. The semiconductor package device of claim 1, wherein a sum of a thickness of the first metal layer and a thickness of the second metal layer is greater than a thickness of the third metal layer.

5. The semiconductor package device of claim 1, wherein the first metal layer and the second metal layer protrude from the bottom surface of the dielectric layer.

6. The semiconductor package device of claim 5, wherein the third metal layer does not protrude from the bottom surface of the dielectric layer.

7. The semiconductor package device of claim 1, wherein the first metal layer comprises at least one of Au, Pd, or Ag.

8. The semiconductor package device of claim 1, wherein the second metal layer comprises at least one of nickel (Ni), Ti, tungsten (W) or aluminum (Al).

9. The semiconductor package device of claim 1, wherein a thickness of the conductive pad is equal to or less than about 5 micrometer ($\mu$m).

10. The semiconductor package device of claim 1, wherein a thickness of the first metal layer is greater than a thickness of the second metal layer.

11. The semiconductor package device of claim 1, further comprising a plurality of patterned conductive layers including a first patterned conductive layer and a second patterned conductive layer disposed further from the conductive pad than is the first patterned conductive layer, wherein a line width and line space (L/S) of the first patterned conductive layer is greater than an L/S of the second patterned conductive layer.

12. The semiconductor package device of claim 11, wherein the L/S of the first patterned conductive layer is in a range of about 5 $\mu$m to about 15 $\mu$m, and the L/S of the second conductive patterned layer is in a range of about 2 $\mu$m to about 5 $\mu$m.

13. The semiconductor package device of claim 1, wherein the solder bump covers a portion of the lateral surface of the first metal layer.

14. The semiconductor package device of claim 1, wherein the electronic component is disposed on the top surface of the dielectric layer.

15. A semiconductor package device, comprising:
an interconnection structure, comprising:
a dielectric layer having a top surface and a bottom surface, the dielectric layer defining a cavity extending from the bottom surface into the dielectric layer;
a patterned conductive layer disposed on the top surface of the dielectric layer;
a conductive pad at least partially disposed within the cavity and electrically connected to the patterned conductive layer, the conductive pad comprising a first metal layer a second metal layer and a third metal layer, wherein the second metal layer is disposed on the first metal layer and extends along a lateral surface of the first metal layer, and the third metal layer is disposed on the second metal layer and extends along a lateral surface of the second metal layer without extending along the bottom surface of the dielectric layer;
an electronic component electrically connected to the patterned conductive layer;
a first package body covering the electronic component and the patterned conductive layer;
a substrate; and
a solder bump electrically connecting the conductive pad to the substrate,
wherein the second metal layer is disposed between the solder bump and the third metal layer, at least a portion of the second metal layer is in contact with the solder bump, and the second metal layer is configured to function as a barrier layer.

16. The semiconductor package device of claim 15, wherein the substrate comprises a patterned conductive layer with an L/S greater than or equal to about 10 $\mu$m.

17. The semiconductor package device of claim 15, wherein the patterned conductive layer of the interconnection structure has an L/S less than or equal to about 10 $\mu$m.

18. The semiconductor package device of claim 15, wherein a diameter of the solder bump is in a range of about 0.1 millimeter (mm) to about 0.3 mm.

19. The semiconductor package device of claim 15, wherein the electronic component is electrically connected to the patterned conductive layer through a flip-chip technique.

20. The semiconductor package device of claim 15, further comprising an underfill disposed between the dielectric layer and the substrate to cover the solder bump.

21. The semiconductor package device of claim 15, further comprising a second package body covering the first package body, the interconnection structure and the solder bump.

22. The semiconductor package device of claim 15, wherein a thickness of the conductive pad is equal to or less than about 5 $\mu$m.

23. The semiconductor package device of claim 15, wherein the electronic component is disposed on the top surface of the dielectric layer.

* * * * *